(12) United States Patent
Kinoshita et al.

(10) Patent No.: US 7,626,774 B2
(45) Date of Patent: Dec. 1, 2009

(54) SOLID-STATE IMAGING DEVICE AND ELECTRONIC DEVICE INCLUDING SAME

(75) Inventors: Kazuo Kinoshita, Hiroshima (JP); Yoshikazu Ohara, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 114 days.

(21) Appl. No.: 12/079,520

(22) Filed: Mar. 27, 2008

(65) Prior Publication Data
US 2008/0239522 A1  Oct. 2, 2008

(30) Foreign Application Priority Data
Mar. 28, 2007  (JP)  ............................. 2007-085925

(51) Int. Cl.
  *G02B 7/02* (2006.01)
(52) U.S. Cl. .................... 359/822; 359/811; 359/819
(58) Field of Classification Search ................. 359/811, 359/813, 814, 819, 821, 822, 823, 824
See application file for complete search history.

(56) References Cited

U.S. PATENT DOCUMENTS 7,555,210 B2 *  6/2009  Calvet ......................... 396/79

FOREIGN PATENT DOCUMENTS

| JP | 2005-070609 | 3/2005 |
|---|---|---|
| JP | 2005-236754 | 9/2005 |
| JP | 2006-120993 | 5/2006 |

* cited by examiner

*Primary Examiner*—Timothy J Thompson
(74) *Attorney, Agent, or Firm*—David G. Conlin; Steven M. Jensen; Edwards Angell Palmer & Dodge LLP

(57) ABSTRACT

A camera module of the present invention includes a plurality of projections 61b on a bottom base of a driving section 61 of an AF/Zoom module. The projections 61b are radially extended from an aperture 63 formed on an optical path. By this, adhesive can be spread over the projections 61b when bonding a lens holder and the AF/Zoom module together. Furthermore, even if the adhesive is excessively applied, excessive adhesive can be retained between the projections 61b. As a result, it is possible to realize a solid-state imaging device which makes it possible to improve adhesive strength between the lens holder and the AF/Zoom module and easily bond the lens holder and the AF/Zoom module.

9 Claims, 9 Drawing Sheets

SOLID-STATE IMAGING DEVICE AND ELECTRONIC DEVICE INCLUDING SAME

This Nonprovisional application claims priority under 35 U.S.C. §119(a) on Patent Application No. 085925/2007 filed in Japan on Mar. 28, 2007, the entire contents of which are hereby incorporated by reference.

FIELD OF THE INVENTION

The present invention relates to a solid-state imaging device and an electronic device including the solid-state imaging device. More particularly, the present invention relates to the solid-state imaging device which is suitably applicable to electronic devices such as a camera phone, a digital still camera, and a security camera.

BACKGROUND OF THE INVENTION

A solid-state imaging device (camera module) which is applied to a camera phone and a digital still camera is normally arranged such that a solid-state image sensor, a digital signal processor (DSP), a lens, a lens holder (housing), a lens barrel, etc. are integrated into a package. In addition, recently, a mechanical part for providing a focusing function such as autofocus (AF) and zoom functions with the solid-state imaging device is bonded and fixed to a wiring board or any other part of the solid-state imaging device with adhesive.

Conventionally, the mechanical part for providing the focusing function is bonded to its counterpart to be bonded to the mechanical part with the adhesive applied on either the mechanical part or the counterpart. For example, the adhesive is applied to a bonding surface by using an application nozzle in such a manner that the application nozzle scans the bonding surface of either part with one stroke.

After the application of the adhesive, a bond of the mechanical part for providing the focusing function is completed by hardening the adhesive with the both parts kept in contact with each other tightly.

However, in such a bond, excess adhesive may be squeezed out of the bonding surface. On the other hand, a shortage of applied adhesive may result in an adhesion failure. Thus, it is difficult to adjust an application amount of the adhesive, especially for a camera module which is applied to a cellular phone.

In view of the problem, for example, Patent Document 1 discloses an art of an image sensor module. The art aims at preventing the adhesive from being applied unevenly and being squeezed out of the bonding surface. FIG. 14 is a cross-sectional view of the image sensor module of Patent Document 1. An image sensor module 500 in FIG. 14 includes grooves 514 each of which is provided on a part of the bonding surface of a lens holder 511 (the lens holder 511 is to be adhered with a wiring board 515 at the bonding surface). The lens holder 511 is fixed to the wiring board 515 by the adhesive which fills the grooves 514. Specifically, by filling the grooves 514 with the adhesive while the lens holder 511 and the wiring board 515 being appressed against each other, the lens holder 511 and the wiring board 515 are joined and fixed to each other. This arrangement of Patent Document 1 thus prevents the adhesive from being applied unevenly and thereby improves quality and workability of the bonding. Also, this arrangement prevents the adhesive from being squeezed out of the bonding surface.

Patent Document 1 also discloses that the same effect as the arrangement with the grooves 514 can be obtained from another arrangement such that the adhesive fills a taper section (not shown in figures), instead of the grooves 514, which taper section is formed on lateral sides to the bottom base of the lens holder 511.

<Patent Document 1>
Japanese Unexamined Patent Publication No. 236754/2005 (Tokukai 2005-236754 (Date of publication: Sep. 2, 2005))

However, the image sensor module of Patent Document 1 has a problem that adhesive strength is insufficient.

According to Patent Document 1, specifically, the adhesive fills only the grooves 514 as illustrated in FIG. 14. With this arrangement, improvement in the quality of the bond can be expected to a certain extent by avoiding an uneven application of the adhesive.

According to Patent Document 1, the adhesive fills the grooves 514 with the lens holder 511 and the wiring board 515 appressed against each other. As a result, the lens holder 511 and the wiring board 515 are bonded to each other only by the adhesive which fills the grooves 514. That is, the adhesive is not supplied to a part without the groove 514. Accordingly, adhesive strength is very low because a part involved in the bond is limited to the groove 514. A low adhesive strength allows the mechanical part for providing the focusing function (autofocus function or zoom function) to come easily off from the lens holder 511 after the bond thereto. Therefore, in a case where the mechanical part is incorporated in a cellular phone or a digital still camera, the mechanical part may come off therefrom especially when the phone or the camera are dropped. Such a problem also arises in a case where the taper section is formed instead of the grooves 514.

SUMMARY OF THE INVENTION

In view of the problem, an object of the present invention is to provide a solid-state imaging device and an electronic device which make it possible to improve adhesive strength between a lens holder and a position adjustment section for adjusting a lens position and easily bond the lens holder and the position adjustment section.

In order to attain the object, the solid-state imaging device of the present invention includes: an imaging unit having a solid-state image sensor; and an optical unit including: a lens for guiding extraneous light to a receiving surface of the solid-state image sensor; a position adjustment section for adjusting a position of the lens; and a lens holder for holding therein the lens and the position adjustment section, the position adjustment section being bonded to the lens holder, the lens holder and the position adjustment section each having an aperture being formed on an optical path thereof, and the lens holder or the position adjustment section having a plurality of projections on a holding surface of the lens holder for holding the position adjustment section or on that counterpart surface of the position adjustment section which faces to the holding surface, the plurality of projections being radially extended from the aperture on the holding surface or on the counterpart surface.

According to the invention, the position adjustment section is bonded to the lens holder. Furthermore, the plurality of projections is formed on the holding surface of the lens holder for holding the position adjustment section or on the counterpart surface of the position adjustment section which faces to the holding surface. In other words, the lens holder or the position adjustment section has the plurality of projections on the bonding surface between the lens holder and the position adjustment section. Moreover, the projections are radially extended from the aperture formed on the optical path of the lens holder and the position adjustment section.

By this, upon contact between the lens holder or the position adjustment section and the projections formed on either thereof, adhesive for bonding the lens holder and the position adjustment section together spreads over and along the projections. Accordingly, the adhesive spreads over even areas having no adhesive therein on the projections. As a result, adhesive strength between the lens holder and the position adjustment section can be improved because the adhesive evenly spreads over the projections.

Furthermore, excessive adhesive can be retained between the projections because the excessive adhesive runs between the projections. Accordingly, the excessive adhesive is retained between the projections even if the adhesive is excessively applied to the bonding surface. This makes it possible to easily bond the lens holder and the position adjustment section together without strictly controlling an application amount of the adhesive.

According to the present invention, provision of the plurality of projections thus makes it possible to improve adhesive strength and easily bond the lens holder and the position adjustment section together.

In order to attain the object above, the electronic device of the present invention includes the solid-state imaging device. Accordingly, the present invention can provide an electronic device which makes it possible to improve adhesive strength and easily bond the lens holder and the position adjustment section.

Additional objects, features, and strengths of the present invention will be made clear by the description below. Further, the advantages of the present invention will be evident from the following explanation in reference to the drawings.

DESCRIPTION OF THE EMBODIMENTS

An embodiment of the present invention is described below with reference to figures. However, the present invention is not limited to this.

The solid-state imaging device of the present invention is suitably applicable to such an electronic device which can perform imaging as a camera phone, a digital still camera, and a security camera. The present embodiment describes a camera module (solid-state imaging device) to be applied to the camera phone.

Figure 2:
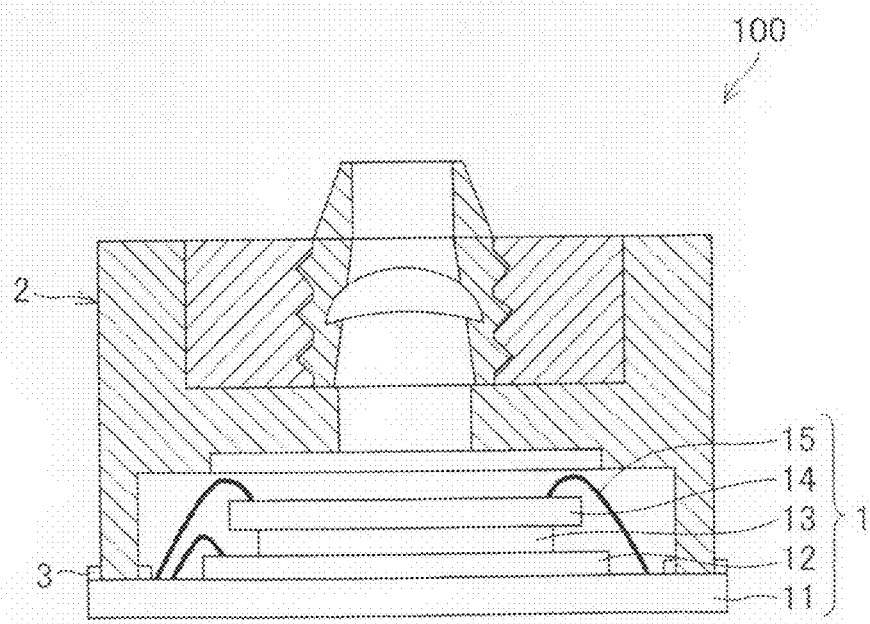
FIG. 2 is a cross-sectional view of the camera module of the present invention.
Figure 3:
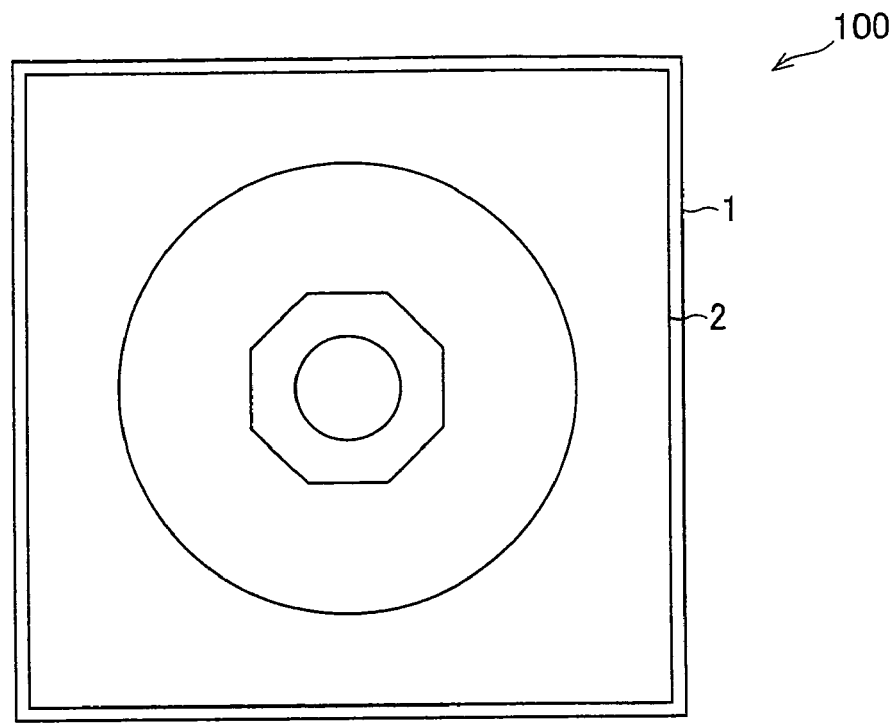
FIG. 3 is a top view of the camera module of FIG. 2.

FIG. 2 is a cross-sectional view of a camera module 100 of the present embodiment. FIG. 3 is a top view of the camera module 100. The camera module 100 is arranged such that an imaging unit 1 and a lens unit (optical unit) 2 are bonded to each other by adhesive 3. The lens unit 2 is mounted on the imaging unit 1. For the sake of simplicity, the lens unit 2 is assumed to be on the upper side and the imaging unit 1 is assumed to be on the lower side in the description below.

<Imaging Unit 1>

The imaging unit 1 is an imaging section for converting a subject image which is formed in the lens unit 2 into an electric signal. In other words, the imaging unit 1 is a sensor device for performing photoelectric conversion on an incident light from the lens unit 2.

As illustrated in FIG. 2, the imaging unit 1 has a structure such that a DSP (digital signal processor) 12, a spacer 13, and a solid-state image sensor 14 are stacked in this order on a wiring board 11. The DSP 12 and the solid-state image sensor 14 each and the wiring board 11 are connected to each other with wires 15.

Members of the imaging unit 1 are described below in detail. The wiring board 11 is a board having patterned wires not shown in the figures. The wiring board 11 is, for example, a printed circuit board, a ceramic circuit board, etc.

Terminals not shown in the figures are formed on the surface of the wiring board 11 (surface on which the DSP 12 etc. are contained). The DSP 12 and the solid-state image sensor 14 which are stacked on a central part of the wiring board 11 are each connected to the terminal on the wiring board 11 via wire 15. By this, the DSP 12 and the solid-state image sensor 14 each and the wiring board 11 are electrically connected and able to transmit/receive electric signals to/from each other.

The DSP 12 is a semiconductor chip for controlling operation of the solid-state image sensor 14 and processing a signal outputted therefrom. In addition to the DSP 12, the wiring board 11 is thereon provided with electronic parts not shown in the figures such as a CPU for performing various computations in accordance with a program, a ROM for storing the program, and a RAM for storing data etc. in each process. The entire camera module 100 is controlled by the electronic parts.

Besides, a plurality of bonding pads (not shown in the figures) for performing input and output, etc. of electric signals is formed on the surface of the DSP 12.

The spacer 13 is located between the DSP 12 and the solid-state image sensor 14 in order to adjust a distance therebetween. That is, height of the spacer 13 is adjusted in order to avoid contact between the one wire 15 connected to the DSP 12 and the other wire 15 connected to the solid-state image sensor 14 and contact between another wire 15 connected to the DSP 12 and the solid-state image sensor 14. For the spacer 13, a silicon chip can be used, for example.

The solid-state image sensor 14 converts a subject image formed in the lens unit 2 into an electric signal. In other words, the solid-state image sensor 14 is a sensor device for performing photoelectric conversion on the incident light from the lens unit 2. The solid-state image sensor 14 is a CCD or a CMOS sensor IC, for example. On the (top) surface of the solid-state image sensor 14, formed is a receiving surface (not shown in the figure) on which a plurality of pixels is arrayed in a matrix pattern. The receiving surface is an area which allows the incident light from the lens unit 2 to pass through (i.e., a light transmissive area). The receiving surface also can be termed a pixel area. An image pickup area of the imaging unit 1 is the receiving surface (pixel area).

The solid-state image sensor 14 converts the subject image formed on the receiving surface (pixel area) into an electric signal and outputs the electric signal as an analog image signal. That is, the photoelectric conversion is performed on the receiving surface. The operation of the solid-state image sensor 14 is controlled by the DSP 12. The image signal generated by the solid-state image sensor 14 is processed by the DSP 12.

<Lens Unit 2>

Figure 4:
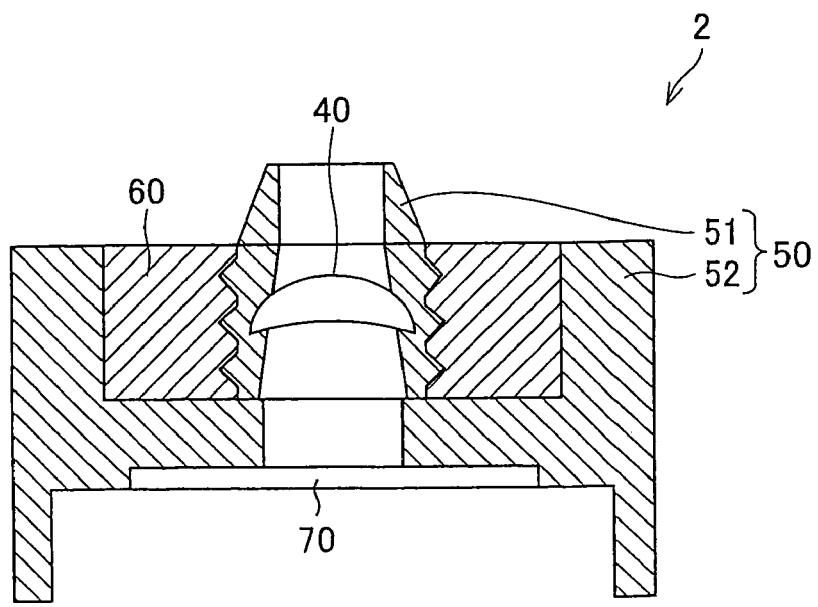
FIG. 4 is a cross-sectional view of a lens unit of the camera module of FIG. 2.

The lens unit 2 is described below. FIG. 4 is a cross-sectional view of the lens unit 2. The lens unit 2 is an imaging optical system (optical structure) for forming the subject image. That is, the lens unit 2 is an optical path determining unit for guiding extraneous light to the receiving surface (image pickup area) of the imaging unit 1.

As illustrated in FIG. 4, the lens unit 2 includes a lens 40, a lens holder 50, an autofocus/zoom module (hereafter AF/Zoom module) 60, and a lid glass 70. The lens holder 50 includes the first holder 51 for holding the lens 40 and the second holder 52 for holding the AF/Zoom module 60. In the lens unit 2, the lens 40, the first holder 51, the AF/Zoom module 60, and the second holder 52 are provided in this order from the center of the lens unit 2.

Specifically, as illustrated in FIG. 4, the lens holder 50 is a frame body for therein holding (supporting) the lens 40 and the AF/Zoom module 60. The lens holder 50, which is a hollow (tube-like) member, therein holds the lens 40 and the AF/Zoom module 60. More specifically, the lens holder 50 includes the first holder 51 for holding the lens 40 and the second holder 52 for holding the AF/Zoom module 60.

Figure 5:
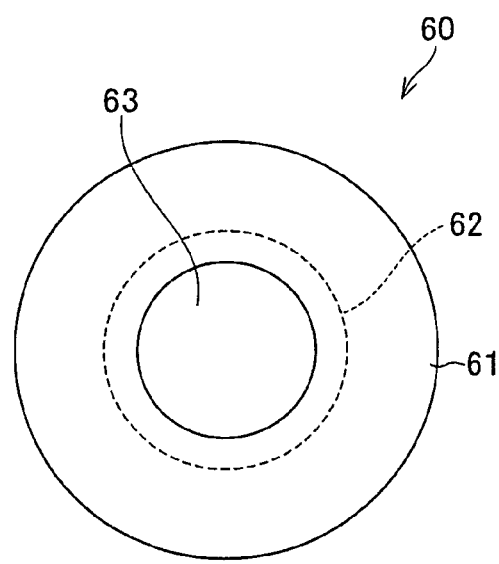
FIG. 5 is a top view of the AF/Zoom module of FIG. 1.
Figure 6:
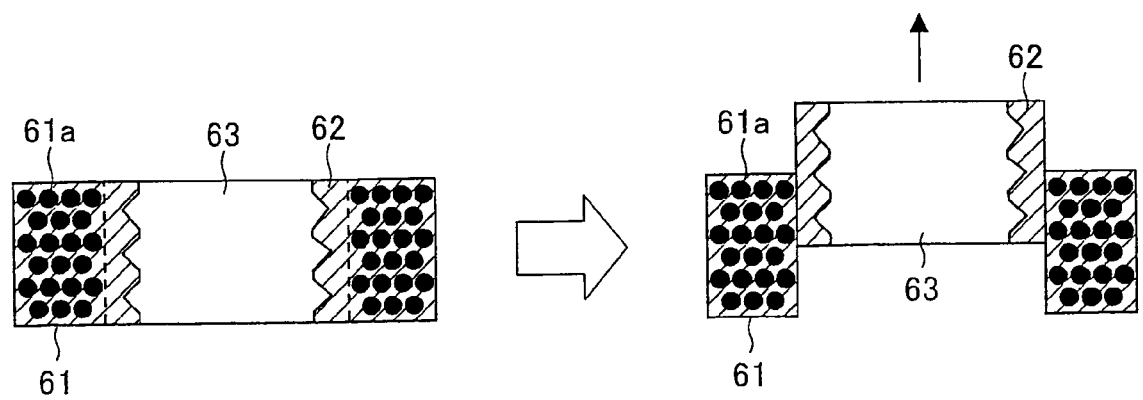
FIG. 6 is a cross-sectional view of the AF/Zoom module of FIG. 1.
Figure 7:
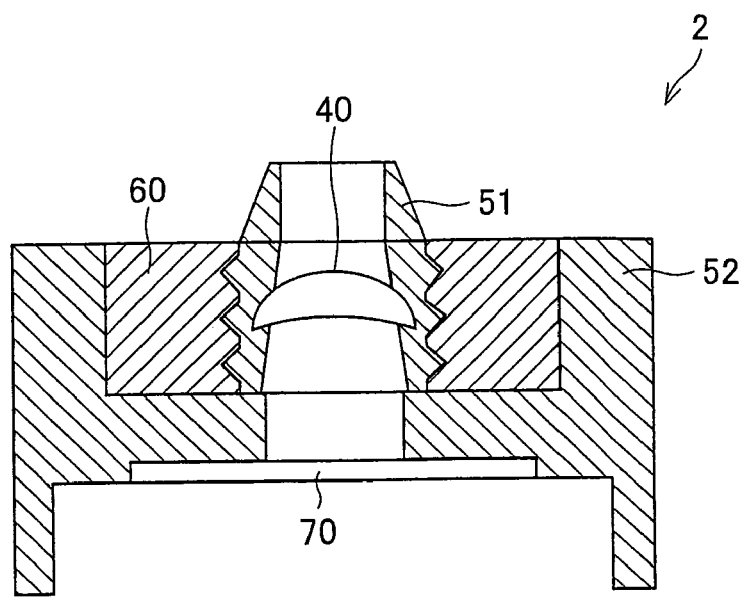
FIG. 7 is a cross-sectional view illustrating adjustment of a lens position in the lens unit of FIG. 4.
Figure 7:
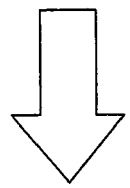
Figure 7:
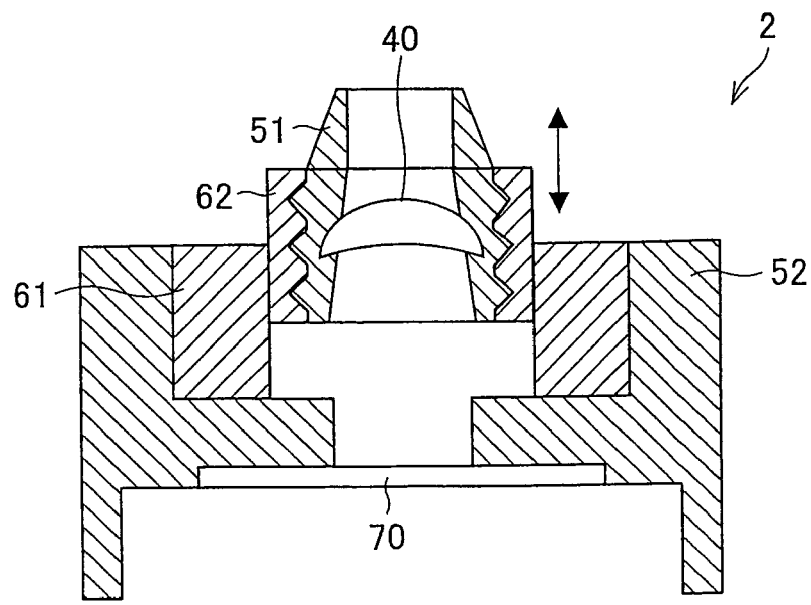

The AF/Zoom module 60 is a module for providing an autofocus function and/or a zoom function with the camera module 100. That is, the AF/Zoom module 60 functions as a position adjustment section for freely adjusting a position of the lens 40. The AF/Zoom module 60 is bonded to the lens holder 50 (the second holder 52). FIG. 5 is a top view of the AF/Zoom module 60. FIG. 6 is a cross-sectional view of the AF/Zoom module 60. FIG. 7 is a cross-sectional view illustrating position adjustment of the lens 40 in the lens unit 2.

As illustrated in FIG. 5, the AF/Zoom module 60 includes a driving section 61 and a moving section 62 held in the driving section 61. In the center of the AF/Zoom module 60, an aperture 63 is formed in order to secure an optical path. As illustrated in FIG. 6, the driving section 61 therein includes a coil (electromagnet) 61*a*. In addition to the coil 61*a*, the driving section 61 includes members not shown in the figure such as a magnet, a linear motor, a gear, an electric wire led into the coil 61*a*, and a spring for limiting movement of the moving section 62. The driving section 61 is driven and thereby a position of the moving section 62 held therein can be changed. In the aperture 63 formed inside the moving section 62, the first holder 51 holding the lens 40 is fitted in a manner which screws the first holder 51 into the aperture 63. As illustrated in FIG. 7, this makes it possible to adjust the position of the lens 40 within a movable range of the moving section 62. Therefore, this makes it possible to adjust the position of the lens 40 in order to obtain any desired focus within the movable range, and fix the lens 40 at an adjusted position. Thus, the camera module 100 can freely change a focal length due to the AF/Zoom module 60.

The lid glass 70 is made from a transparent member such as glass. The lid glass 70 is provided with an IR cut filter on the surface thereof, whereby the lid glass 70 has a function of cutting infrared rays off.

Figure 8:
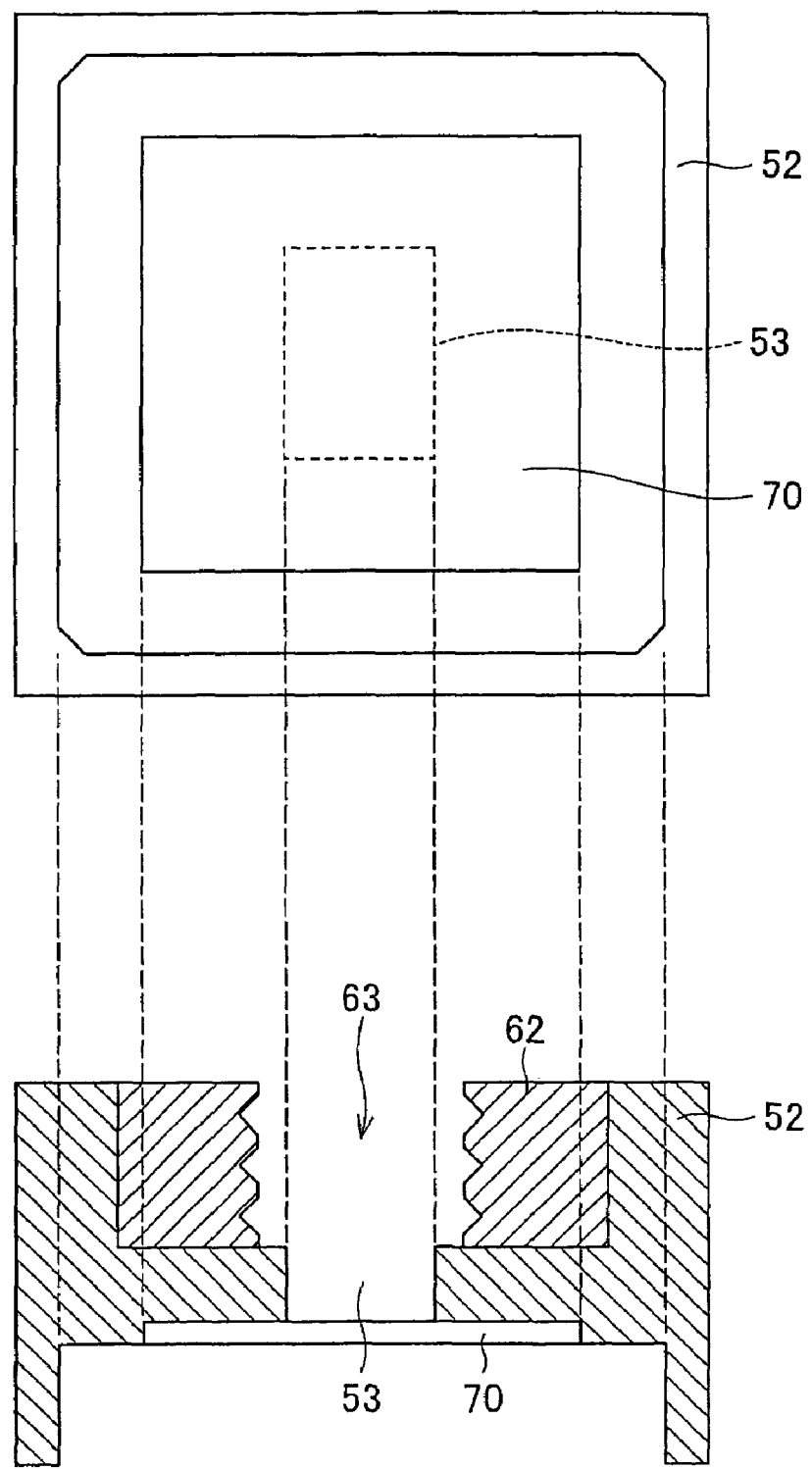
FIG. 8 is a bottom view and a cross-sectional view of the lens unit of FIG. 4.

FIG. 8 is a bottom view and a cross-sectional view of the lens unit 2. As illustrated in FIG. 8, the lid glass 70 is provided on the counterpart surface to a holding surface of the second holder 52 for holding the AF/Zoom module 60. In addition, the lid glass 70 is formed in a manner which closes apertures 53/63 formed on the optical path of the second holder 52 and the AF/Zoom module 60. Furthermore, the lid glass 70 is opposed to the solid-state image sensor 14. This makes it possible to prevent entry of humidity and dust into the solid-state image sensor 14.

Figure 12:
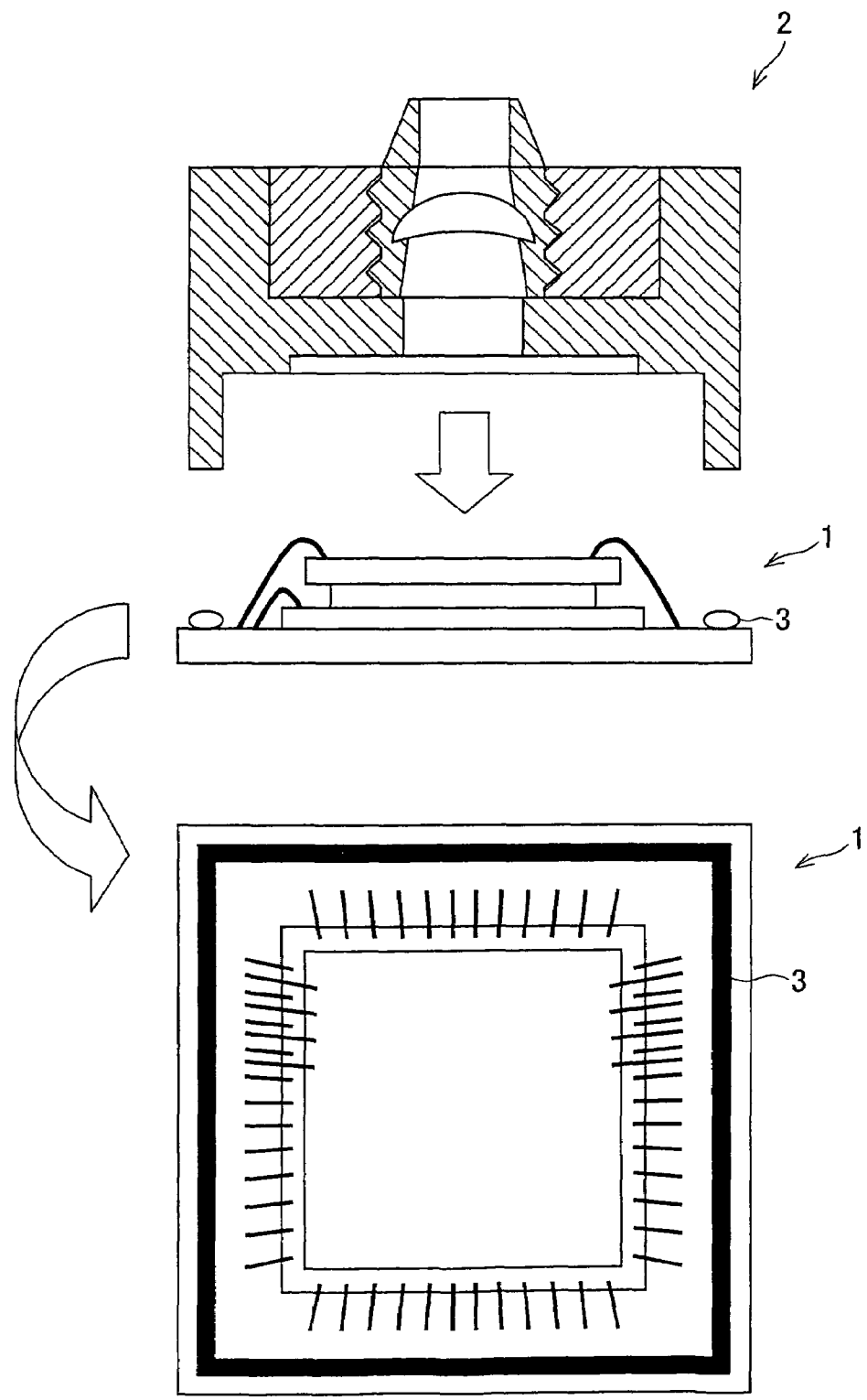
FIG. 12 is a view illustrating a manufacturing process of the camera module of FIG. 2.

When capturing an image with such camera module 100, extraneous light is guided to the receiving surface (image pickup area) of the imaging unit 1 (solid-state image sensor 14) by the lens unit 2, thereby forming the subject image on the receiving surface. The subject image is converted by the imaging unit 1 into an electric signal which is then subjected to various processings (image processing etc.) As illustrated in FIG. 12, the camera module 100 is formed by bonding the lens unit 2 onto the imaging unit 1 with the adhesive 3 applied around members of the imaging unit 1.

The AF/Zoom module 60, which is a characteristic arrangement of the camera module 100, is described below more specifically. As described, the AF/Zoom module 60 is bonded to the second holder 52. When bonding the AF/Zoom module 60 to the second holder 52, excessive adhesive drips on the lid glass 70. As a result, a captured image becomes defective because the adhesive protrudes across the optical path. On the other hand, insufficient adhesive causes a decrease in adhesive strength. This results in an adhesion failure. Accordingly, the AF/Zoom module 60 would be fallen from the second holder 52. Therefore, the adhesive strength needs to be maintained by controlling an application amount of the adhesive. Besides, usage of the adhesive is preferably as easy as possible for improvement of production efficiency.

Figure 1:
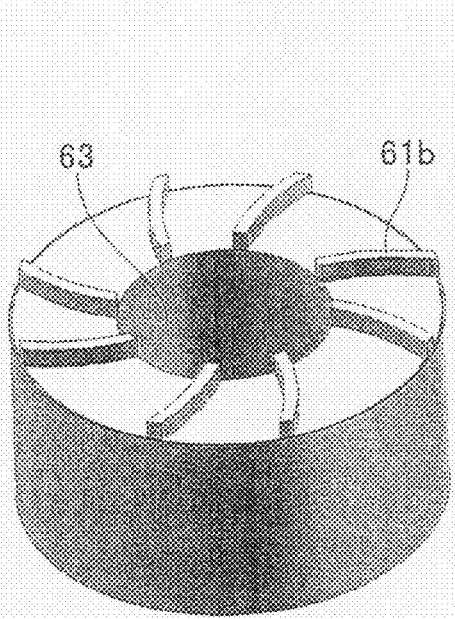
FIG. 1 is a perspective view of an AF/Zoom module in a camera module of the present invention.
Figure 9:
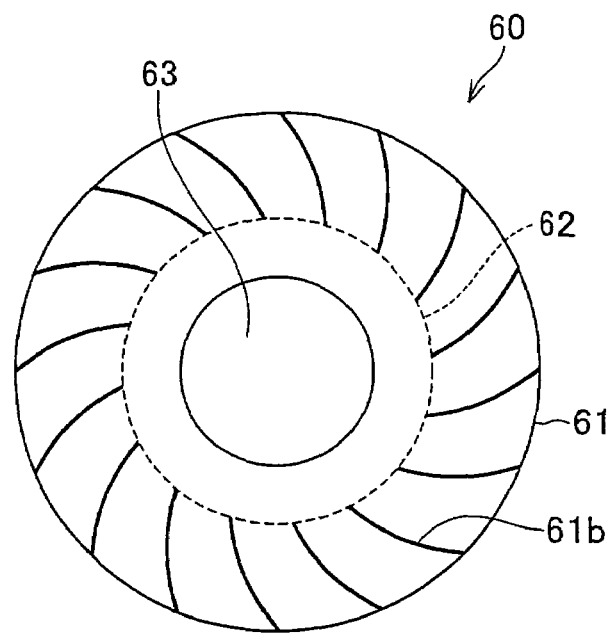
FIG. 9 is a bottom view of the AF/Zoom module of FIG. 1.

In the camera module 100 of the present embodiment, the AF/Zoom module 60 increases the adhesive strength. FIG. 1 is a perspective view of the bottom base of the AF/Zoom module 60. FIG. 9 is a bottom view of the AF/Zoom module 60. Specifically, as illustrated in the figures, a plurality of projections 61*b* is formed on the bottom base of the AF/Zoom module 60.

More specifically, the plurality of projections 61*b* is formed on the bottom base of the AF/Zoom module 60 (the counterpart surface which faces to the holding surface of the second holder 52 for holding the AF/Zoom module 60). In the center of the AF/Zoom module 60, the aperture 63 is formed in order to secure the optical path. The projections 61*b* are formed in such a manner that the projections 61*b* are radially extended from the aperture 63. Each projection 61*b* may be extended linearly or nonlinearly as long as the projection 61*b* is radially extended as described.

In the present embodiment, as illustrated in FIGS. 1 and 9, each projection 61*b* is extended archly from the aperture 63 to an outer edge of the AF/Zoom module 60. In addition, width between two adjacent projections 61*b* becomes wider from the aperture 63 to the outer edge. Furthermore, the projections 61*b* are formed in a spiral pattern. Portions without the projections 61*b* are recess portions.

Figure 10:
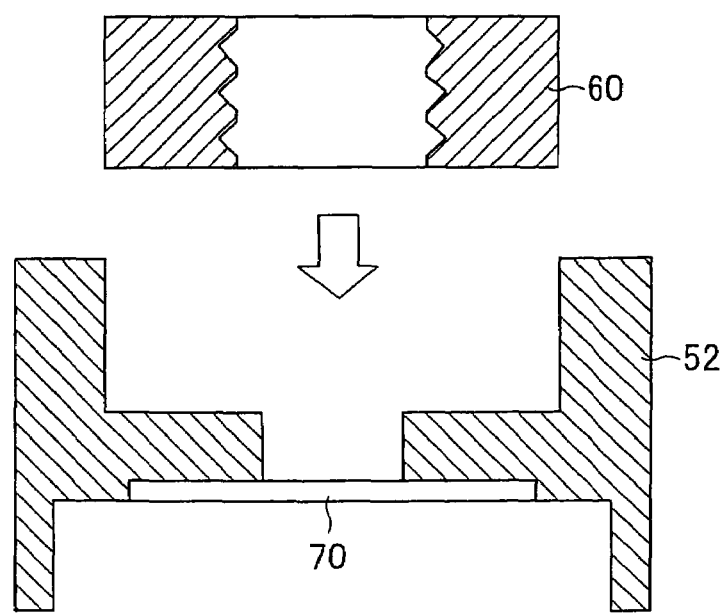
FIG. 10 is a cross-sectional view illustrating a step of bonding the AF/Zoom module to a lens holder.
Figure 11:
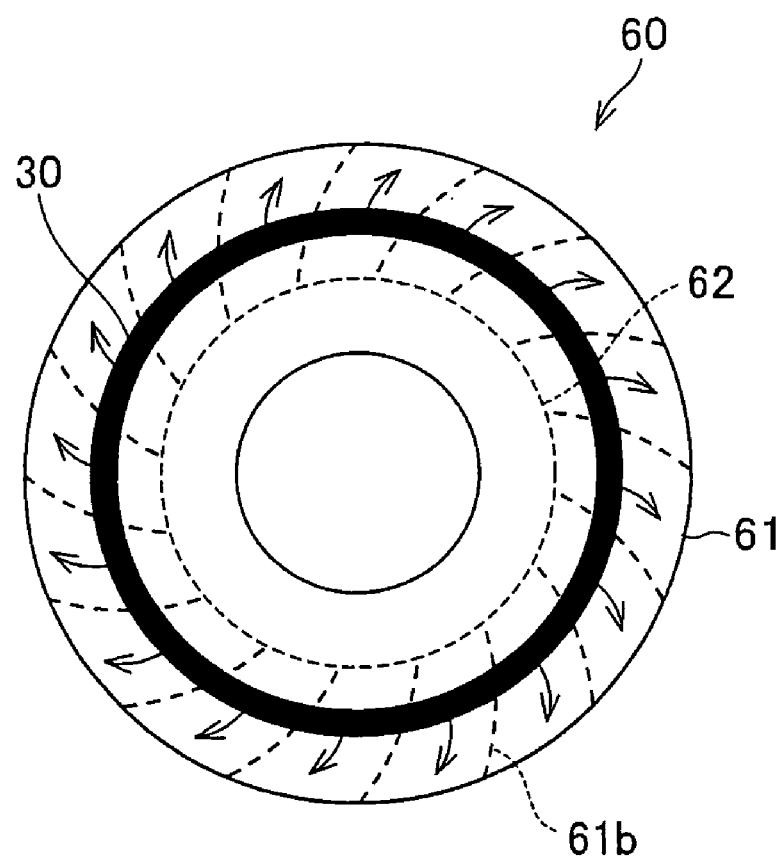
FIG. 11 is a view illustrating traveling directions of adhesive on a bottom base of the AF/Zoom module.

FIG. 10 is a cross-sectional view illustrating a step of bonding the AF/Zoom module 60 to the second lens holder 52. FIG. 11 is a view illustrating flowing directions of the adhesive on the bottom base of the AF/Zoom module 60.

In order to bond the AF/Zoom module 60 onto the second holder 52 as illustrated in FIG. 10, the adhesive is applied to at least one of the second holder 52 and the AF/Zoom module 60. The AF/Zoom module 60 and the second holder 52 are bonded to each other by mounting the AF/Zoom module 60 on the holding surface of the second holder 52 for holding the AF/Zoom module 60.

When bonding the AF/Zoom module 60 onto the second holder 52, as arrows indicate in FIG. 11, adhesive 30 evenly spreads over the bottom base of the AF/Zoom module 60. Specifically, for example, the adhesive 30 is applied to the AF/Zoom module 60 as illustrated in FIG. 11. The AF/Zoom module 60 is thereafter mounted onto the second holder 52. The projections 61b and the second holder 52 thereby come into contact with each other. By this, the adhesive 30 on the projections 61b spreads over even areas having no adhesive 30 therein on the projections 61b. As a result, the adhesive 30 spreads over the projections 61b. Besides, excessive adhesive 30 runs along the projections 61b and spreads between the projections 61b. Accordingly, the adhesive 30 evenly spreads over the bottom base of the AF/Zoom module 60. That is, the adhesive 30 evenly spreads over bonding surfaces of the second holder 52 and the AF/Zoom module 60.

Thus, by the provision of the projections 61b, the camera module 100 makes it possible to evenly spread the adhesive over the entire bonding surfaces of the second holder 52 and the AZ/Zoom module 60. This can accordingly improve the adhesive strength between the second holder 52 and the AF/Zoom module 60. Moreover, even if the adhesive is excessively applied, excessive adhesive is retained between the projections 61b because the adhesive spreads over the projections 61b due to the contact between the projections 61b and the second holder 52. Accordingly, an application amount of the adhesive does not have to be controlled strictly. Therefore, the second holder 51 and the AF/Zoom module 60 can be easily bonded to each other.

Specifically, in a case where the retained adhesive between the projections 61b reaches to the same height as the projections 61b, the entire bottom base of the AF/Zoom module 60 works as a bonding surface to the second holder 52. In other words, with the adhesive which fills gaps between the projections 61b, the entire bottom base of the AF/Zoom module 60 works as a bonding surface to the second holder 52. This makes it possible to further improve the adhesive strength between the second holder 52 and the AF/Zoom module 60 and prevent the adhesion failure more surely.

In the present embodiment, each projection 61b is extended archly from the aperture 63 to the outer edge of the AF/Zoom module 60. That is, each projection 61b is formed nonlinearly and extended with a curve in an arc. This can realize a wider contact dimension between the projections 61b and the second holder 52 than a case where the projections 61b are linearly formed. Thus, it is possible to improve the adhesive strength between the second holder 52 and the AF/Zoom module 60 and prevent the adhesion failure.

In the present embodiment, width between two adjacent projections 61b becomes wider from the aperture 63 to the outer edge of the AF/Zoom module 60. By this, excessive adhesive can be surely retained between the projections 61b because areas between the projections 61b can be kept wide. Thus, it is possible to surely prevent an escape of the adhesive.

That is, by taking up wider those areas on the bottom base of the AF/Zoom module 60 in which the projections 61b are formed (projection-formed areas) than areas in which the projections 61b are not formed (non-projection-formed areas), the contact dimension between the projections 61b and the second holder 52 becomes wider. Accordingly, the adhesive strength between the second holder 52 and the AZ/Zoom module 60 can be improved further.

In contrast, by taking up narrower the projection-formed areas than the non-projection-formed areas, the areas between the projections 61b can be taken wider. Therefore, excessive adhesive can be surely retained between the projections 61b. As a result, it is possible to surely prevent the escape of the adhesive.

In the present embodiment, the plurality of projections 61b is formed in a spiral pattern. This makes it possible to prevent the entry of light, which is unnecessary for capturing an image (light which does not pass through the lens 40), from between the projections 61b.

The number, a form, height of the projections 61b and the width therebetween are not limited to the arrangements illustrated in the drawings as long as the adhesive has a function of spreading over the bonding surface. For example, $b/a \leq 1$ is preferably satisfied where "a" is a width of a recess which is formed between two adjacent projections 61b and "b" is a width of the single projection 61b. By increasing "a" within a range satisfying the expression, excessive adhesive 30 can be retained between the projections 61b. Relation between the projection and the recess is opposite where $b/a > 1$.

Figure 13:
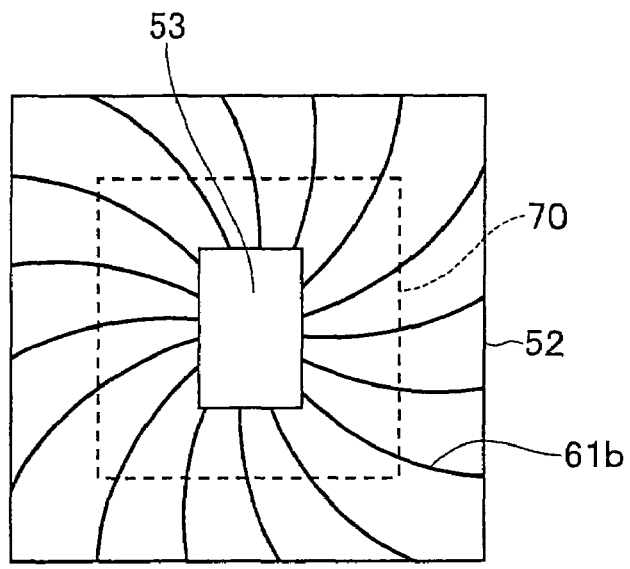
FIG. 13 is a top view of the lens holder with a plurality of projections formed on a holding surface thereof for holding the AF/Zoom module.
Figure 14:
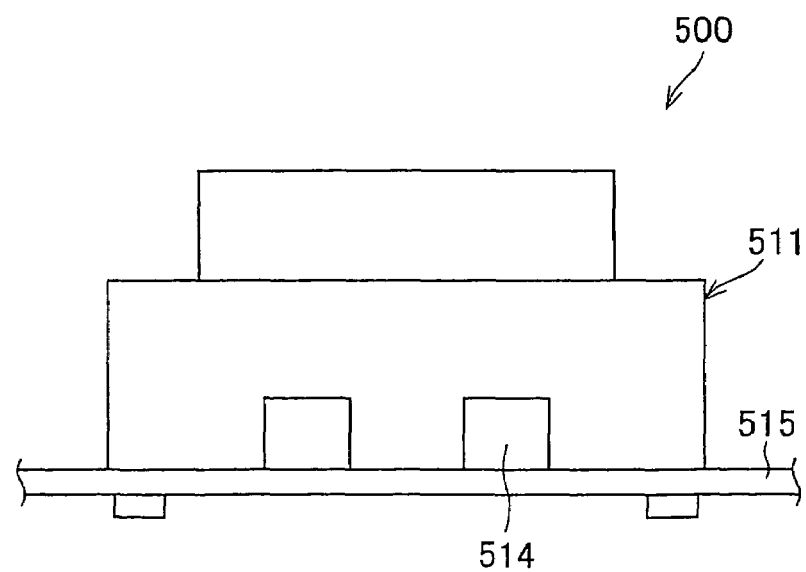
FIG. 14 is a cross-sectional view of an image sensor module of Patent Document 1.

The present embodiment describes an arrangement such that the projections 61b are formed on the bottom base of the AF/Zoom module 60. However, the projections 61b may be formed on the holding surface of the lens holder 50 for holding the AF/Zoom module 60 (i.e., the bonding surface of the second holder 52 at which the second holder 52 is to be bonded with the AF/Zoom module 60). FIG. 13 is a top view of the second holder 52 on which the plurality of projections 61b is formed. In this arrangement, the plurality of projections 61b is formed on the holding surface of the second holder 52 for holding the AF/Zoom module 60. The projections 61b are radially extended from the aperture 53 which is formed on the optical path. Accordingly, this produces the same effect as the arrangement described above such that the projections 61b are formed on the AZ/Zoom module 60.

As described, the solid-state imaging device of the present invention is arranged such that the lens holder and the position adjustment section each has an aperture formed on an optical path thereof and a plurality of projections is formed on a holding surface of the lens holder for holding the position adjustment section or on that counterpart surface of the position adjustment section which faces to the holding surface, the plurality of projections being radially extended from the aperture on the holding surface or on the counterpart surface.

By this, the adhesive strength between the lens holder and the position adjustment section can be improved because the adhesive can be evenly spread over the projections. In addition, the lens holder and the position adjustment section can be easily bonded to each other without strictly controlling an application amount of the adhesive because excessive adhesive can be retained between the projections. Accordingly, the provision of the plurality of projections makes it possible to improve the adhesive strength and easily bond the lens holder and the position adjustment section together.

The solid-state imaging device of the present invention is preferably arranged such that each projection is extended archly from the aperture to an outer edge of the lens holder or the position adjustment section.

According to the invention, each projection is extended archly from the aperture of the lens holder or the position adjustment section to the outer edge. That is, each projection is extended nonlinearly (with a curve). By this, a dimension of one projection is wider than a projection which is extended linearly. Accordingly, the adhesive strength between the lens holder and the position adjustment section can be improved, thereby preventing the adhesion failure.

The solid-state imaging device of the present invention is preferably arranged such that width between two adjacent projections becomes wider from the aperture to the outer edge of the lens holder or the position adjustment section.

According to the invention, the width between the two adjacent projections becomes wider toward the outer edge of the bonding surface between the lens holder and the position adjustment section. That is, the plurality of projections is formed in such a manner that the width between the adjacent projections may be wider toward the outer edge of the bonding surface. This makes it possible to take up wide areas between the projections. Therefore, excessive adhesive can be surely retained between the projections. As a result, the escape of the adhesive can be prevented surely.

The solid-state imaging device of the present invention is preferably arranged such that the plurality of projections is formed in a spiral pattern.

According to the invention, the plurality of projections arcs in the same direction in a spiral pattern. This makes it possible to prevent the entry of light, which is unnecessary for capturing an image (light which does not pass through the lens), from between the projections, in contrast with a case where the projections are linearly formed.

The solid-state imaging device of the present invention may be arranged such that the projection-formed area on the holding surface or the counterpart surface is wider than the non-projection-formed area on the holding surface or the counterpart surface. In other words, the plurality of projections may be formed so that the projections may account for 50% or more of a dimension of the holding surface or the counterpart surface.

According to the invention, areas for the projections are taken up wider than the areas between the projections. By this, the contact dimension between the lens holder and the position adjustment section becomes wider. As a result, the adhesive strength between the lens holder and the position adjustment section can be improved further.

The solid-state imaging device of the present invention may be arranged such that the projection-formed area on the holding surface or the counterpart surface is narrower than the non-projection-formed area on the holding surface or the counterpart surface. In other words, the plurality of projections may be formed so that the projections may account for less than 50% of the dimension of the holding surface or the counterpart surface.

According to the invention, the areas between the projections are taken up wider than the areas for the projections. By this, excessive adhesive can be surely retained between the projections. Accordingly, the escape of the adhesive can be surely prevented.

An electronic device of the present invention includes any of the solid-state imaging devices above. Therefore, it is possible to provide an electronic device which makes it possible to improve the adhesive strength and easily bond the lens holder and the position adjustment section together.

According to the present invention, it is possible to improve the adhesive strength of parts to be fixed by adhesive etc. in the solid-state imaging device, which is applied to electronic devices for capturing an image, such as a camera phone, a digital still camera, and a security camera.

The present invention is not limited to the embodiments described above, and may be modified within the scope of the claims. An embodiment based on a proper combination of technical means disclosed in different embodiments is also encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A solid-state imaging device, comprising:
an imaging unit having a solid-state image sensor; and
an optical unit including:
  a lens for guiding extraneous light to a receiving surface of the solid-state image sensor;
  a position adjustment section for adjusting a position of the lens; and
  a lens holder for holding therein the lens and the position adjustment section,
the position adjustment section being bonded to the lens holder,
the lens holder and the position adjustment section each having an aperture being formed on an optical path thereof, and
the lens holder or the position adjustment section having a plurality of projections on a holding surface of the lens holder for holding the position adjustment section or on that counterpart surface of the position adjustment section which faces to the holding surface, the plurality of projections being radially extended from the aperture on the holding surface or on the counterpart surface.

2. The solid-state imaging device as set forth in claim 1, wherein each projection is extended archly from the aperture to an outer edge of the lens holder or the position adjustment section.

3. The solid-state imaging device as set forth in claim 1, wherein width between two adjacent projections becomes wider from the aperture to an outer edge of the lens holder or the position adjustment section.

4. The solid-state imaging device as set forth in claim 1, wherein the plurality of projections is formed in a spiral pattern.

5. The solid-state imaging device as set forth in claim 1, wherein a projection-formed area on the holding surface or the counterpart surface is wider than a non-projection-formed area on the holding surface or the counterpart surface.

6. The solid-state imaging device as set forth in claim 1, wherein a projection-formed area on the holding surface or the counterpart surface is narrower than a non-projection-formed area on the holding surface or the counterpart surface.

7. The solid-state imaging device as set forth in claim 1, wherein the plurality of projections is formed on the counterpart surface of the position adjustment section.

8. The solid-state imaging device as set forth in claim 1, wherein adhesive fills gaps between the plurality of projections.

9. An electronic device, comprising a solid-state imaging device,
the solid-state imaging device comprising:
  an imaging unit having a solid-state image sensor; and
  an optical unit including:
    a lens for guiding extraneous light to a receiving surface of the solid-state image sensor;
    a position adjustment section for adjusting a position of the lens; and
    a lens holder for holding therein the lens and the position adjustment section, the position adjustment section being bonded to the lens holder, the lens holder and the position adjustment section each having an aperture being formed on an optical path thereof, and the lens holder or the position adjustment section having a plurality of projections on a holding surface of the lens holder for holding the position adjustment section or on that counterpart surface of the position adjustment section which faces to the holding surface, the plurality of projections being radially extended from the aperture on the holding surface or on the counterpart surface.

* * * * *